United States Patent
Ho et al.

[19]
[11] Patent Number: 6,054,732
[45] Date of Patent: *Apr. 25, 2000

[54] SINGLE POLYSILICON FLASH EEPROM WITH LOW POSITIVE PROGRAMMING AND ERASING VOLTAGE AND SMALL CELL SIZE

[75] Inventors: Chi-Chien Ho; William R. McKee, both of Plano, Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 09/016,616

[22] Filed: Jan. 30, 1998

Related U.S. Application Data

[60] Provisional application No. 60/037,897, Feb. 11, 1997.

[51] Int. Cl.[7] .......................... H01L 29/76; H01L 29/88; H01L 29/792
[52] U.S. Cl. .......................... 257/314; 257/315; 257/316; 257/324
[58] Field of Search .................... 257/314–324; 438/257–264; 365/185

[56] References Cited

U.S. PATENT DOCUMENTS

| | | | |
|---|---|---|---|
| 5,465,231 | 11/1995 | Ohsaki | 257/315 |
| 5,501,996 | 3/1996 | Yang et al. | 438/259 |

FOREIGN PATENT DOCUMENTS 0776049   5/1997   European Pat. Off. .

OTHER PUBLICATIONS

A Scaled 0.6 μm High Speed PLD Technology Using Single–Poly EEPROM's: Adam et al. IEEE Custom Integratet Circuits Conference, 1995.
A New Single–poly Flash Memory Cell with Low–Voltage and Low–power Operation for Embeded Applications: Chi et al. Advanced Technology Group, National Semiconductor Cor (408)–721–5390.
High Robust 0.25 μm Single–poly–gate CMOS with Inter–Well deep Trenches. Inokawa et al. 1996 Symposium on VLSI Technology Digest of Technical Papers, 1996.
Single Poly Cell as the Best Choice for Radiation–Hard Floating Gate EEPROM Technology. Wellekens et al. IEEE Transactions on Nuclear Science, vol. 40, No. 6, Dec. 1993.

*Primary Examiner*—Minh Loan Tran
*Assistant Examiner*—Cuong Quang Nguyen
*Attorney, Agent, or Firm*—Robby T. Holland; Richard L. Donaldson

[57] ABSTRACT

A single polysilicon memory cell (10) provides a positive low programming and erase voltage together with a small cell size and includes P substrate (12) and P-well (14) formed within P substrate (12). NMOS transistor (16) is formed within P-well (14). $N^+$ control gate (26) is formed in P-well (14) and includes punch-through implant region (26). NMOS transistor (16) and $N^+$ control gate (26) have in common electrically isolated polysilicon gate (22, 32) for operating as a floating gate in common with NMOS transistor (16) and $N^+$ control gate (26). $N^+$ control gate (26) includes P-channel punch-through implant (34) for increasing the capacitive coupling ratio. This improves programming and erasing efficiency within single polysilicon memory cell (10).

8 Claims, 3 Drawing Sheets

Vdd=5VOLT Vpp=5VOLT Vss=GROUND
PROGRAM BY CHE

Vdd=Vss=9VOLT  Vpp=Vbb=0VOLT

SINGLE POLYSILICON FLASH EEPROM WITH LOW POSITIVE PROGRAMMING AND ERASING VOLTAGE AND SMALL CELL SIZE

This is a Non Provisional application filed under 35 USC 119(e) and claims priority of prior provisional, Ser. No. 60/037,897 of inventor Ho, et al., filed Feb. 11, 1997.

TECHNICAL FIELD OF THE INVENTION

The present invention relates to semiconductor devices and methods for fabricating such devices and, more particularly, to electronic memory devices and, even more particularly, to a single polysilicon flash EEPROM capable of using low programming and erasing voltages and formed of a small cell size.

BACKGROUND OF THE INVENTION

Basic input/output systems (BIOS) or microcodes are stored on memory devices such as EEPROMs and used to control microprocessors and logic circuits. Today's flexible system-on-system chip architectures require embedded EEPROMs to make possible easy updates of microcode in system configurations. However, generally, EEPROMs require special multi-polysilicon processes and multi-oxidation steps for thin $SiO_2$ layers. Many masks are needed which result in longer process turnaround times, lower yields, higher costs, and lower reliability.

Integration of various different semiconductor fabrication processes into one specific process generally is complicated and costly. However, K. Ohsaki, et al., "*A Single Poly EEPROM Cell Structure for Use in Standard CMOS Processes,*" IEEE JOURNAL OF SOLID STATE CIRCUITS, Vol. 29, No. 3, March 1994, describes a single polysilicon EEPROM cell structure that may be implemented in a standard CMOS process. This structure consists of adjacently placed NMOS and PMOS transistors with an electrically isolated common polysilicon gate. The common gate works as a "floating gate" and the structure provides an inversion layer as the "control node (gate)." This EEPROM cell (the "Ohsaki Cell") may be easily integrated with CMOS digital an analog circuits, but suffers from severe practical limitations.

Limitations associated with the Ohsaki Cell are fundamental in nature. One limitation is that it requires a high programming and erase voltage. Another limitation is that it requires a big cell size. Suffering from both of these limitations makes the Ohsaki Cell unacceptable for a simple DRAM fabrication process.

In the conventional single polysilicon EEPROM, a particular problem relates to erase techniques. One way to erase these existing structures forces a 5 V level on $V_D$ and $V_S$ and forces a –6 V bias on the control gate and substrate. The substrate can tie to –6 V or be floating. The erase mechanism that results from this procedure is the result of diode breakdown. Unfortunately, this mechanism causes impact ionization and operates as a hole trap to the floating gate. Thus, the problem with this method is that a negative voltage is necessary and the substrate needs to float or tie to the –6 V. In this method, a negative change pump circuit is required.

There are other approaches to erasing structures such as the Ohsaki Cell. One method uses the same type of mechanism as previously described, but ties the control gate to ground. The substrate is tied to a –2 V and very high voltage is forced on the drain and source. This method, unfortunately, produces very poor erase efficiency and results in too high a voltage on the source and drain. The high voltage can cause undesirable stress on the EEPROM.

The third method uses an BVCEO breakdown mechanism which causes impact ionization and a hold trap to form at the floating gate. This method, unfortunately, also has very poor erase efficiency and for many other reasons is much less desirable than the two previously described techniques.

Another limitation of the Ohsaki Cell and similar structures is the need for an N-well to serve as the control gate. This design results in a large EEPROM cell size. With the ever-important design objective of smaller memory circuits, the limitation of requiring a large cell size can seriously affect the usefulness of the single polysilicon flash EEPROM.

SUMMARY OF THE INVENTION

In light of the above-stated limitations, there is a need for an improved single polysilicon flash EEPROM that provides both low positive programming and erase voltage, as well as provides a small cell size.

The present invention, therefore, provides an improved single polysilicon flash EEPROM that overcomes or substantially eliminates the problems of programming and erase voltages, and larger cell size that adversely affect the usefulness of known single polysilicon flash EEPROMs.

According to one aspect of the present invention, there is provided a single polysilicon memory cell for use in CMOS processing and includes a P-substrate, with a P-well formed within the P-substrate, and an NMOS transistor is formed within the P-well. An $N^+$ control gate is also formed in the P-substrate. The NMOS transistor and the $N^+$ control gate have a polysilicon gate that operates as a floating gate in common with the NMOS transistor and the $N^+$ control gate. The $N^+$ control gate includes a P-channel punch-through implant region for increasing the capacitive coupling ratio. This improves the programming and erasing efficiency within said single polysilicon memory cell, thereby permitting these voltages to generally decrease.

A technical advantage of the present invention is that no additional DRAM process steps are needed to produce the reduced size EEPROM cell. Clearly, the ability to achieve this result has significant cost and throughput benefits for systems that employ the present invention.

Another technical advantage of the present invention is that it provides a smaller EEPROM cell size for minimal channel hot electron (CHE) programming voltage and minimal Fowler-Nordheim (F-N) erase voltage. Because the memory cell of the present invention does not require an N-well, as does the Ohsaki Cell, for example, it consumes less space. The result can be, therefore, that more memory cells formed according to the teachings of the present invention may be placed in a given layout area than is possible with known single polysilicon flash EEPROMs and similar devices.

Still, another technical advantage that the present invention provides is both a lower program voltage and a positive only erase voltage. For example, in one embodiment of the present invention, the maximum CHE program voltage did not exceed 5 V, with the threshold voltage shift of 2.5 V after CHE programming for 100 msec. In addition, this same embodiment provided a F-N erase voltage of 9 V on $V_{DD}$ and $V_{SS}$, with zero volts on $V_{PP}$ and $V_{BB}$.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the Figures like numerals being used to refer to like and corresponding parts of the various drawings.

Figure 1:
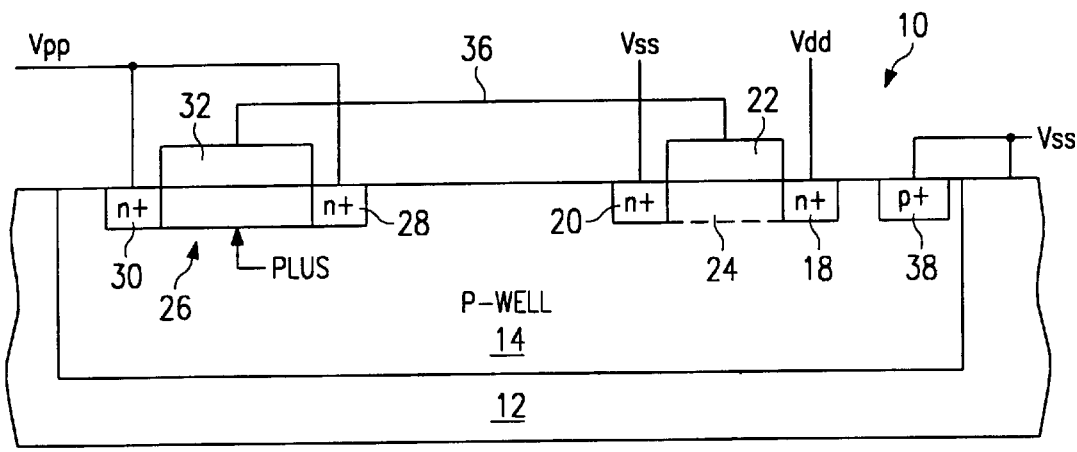
FIG. 1 illustrates one embodiment of the present invention for channel hot electron (CHE) programming.

FIG. 1 illustrates one embodiment of the present invention as a single polysilicon Flash EEPROM cell structure 10 that includes within substrate 12. The structure of FIG. 1 is the structure for channel hot electron (CHE) programming. The single polysilicon Flash EEPROM of the present invention operates in a manner similar to that of the previously described Ohsaki Cell, which description is here incorporated by reference, together with the inventive concepts herein described in detail.

Figure 2:
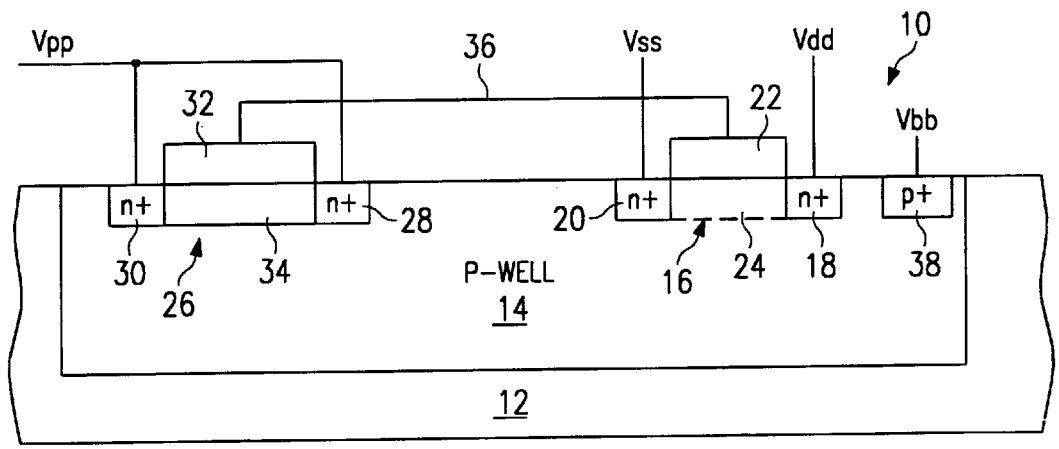
FIG. 2 shows an embodiment of the present invention for Fowler-Nordheim (F-N) erasing.

FIG. 2 shows single polysilicon flash EEPROM 10 of the present invention which includes P-well 14 formed in a P-substrate 12. Single polysilicon flash EEPROM 10 can effectively use low programming and erasing voltages and a small cell size by applying a P-channel transistor punch-through implant on the control gate channel area to increase capacitor coupling ratio. Thus, in P-substrate 12 is P-well 14 in which is formed N-channel transistor 16 that includes N+ region 18 and N+ region 20. Gate region 22 covers P-region 24 of N-channel transistor 16. Also within P-well 14 is N+ control gate 26 which includes N+ region 28 and N+ region 30. Gate region 32 covers punch-through implant region 34. Punch-through implant region 34 may include a phosphorous or arsenic punch through implant. Poly connection 36 connects in common gate region 22 and gate region 32. The $V_{DD}$ pin connects to N+ region 18. $V_{SS}$ connects to N+ region 20. At N+ control gate 26, $V_{PP}$ electrically connects to N+ region 28 and N+ region 30. P-well 12 also includes P+ region 38 which connects to $V_{BB}$. As FIG. 2 shows, during F-N erase for example, $V_{DD}$ and $V_{SS}$ both equal 9 V, while $V_{PP}$ and $V_{BB}$ equal zero volts.

The formation and operation of the EEPROM 10 of the present invention is substantially similar to that of the Ohsaki cell, however with the significant operational advantages of the present invention, as well as the novel structure that includes the punch-through implant region 34. One aspect of the present invention, therefore, is the operational advantage that punch-through implant region 34 provides, which with the associated elements of EEPROM 10 make possible the elimination of the N-well region of the Ohsaki Cell and similar structures to yield a smaller layout requirement for EEPROM 10.

Because of punch-through implant region 34, transistor 26 becomes an N+ control gate for erasing. Thus, not only does the present invention provide the reduced layout area, but also it does so with a device that uses a lower program voltage and a lower erase voltage than do known single polysilicon flash EEPROMS.

Operationally, the present invention makes possible such results as a maximum channel hot electron (CHE) program voltage of 5 V and a threshold voltage shift of only 2.5 V after CHE program for 100 μsec. During an erase operation, the present embodiment can effectively use a maximum Fowler-Nordheim (F-N) erase voltage of 9 V on $V_{DD}$ and $V_{SS}$, with 0.0 V on $V_{PP}$ and $V_{BB}$, while achieving a threshold voltage recover after FN erase of approximately 1 msec. The following graphs illustrate these points.

Figure 3:
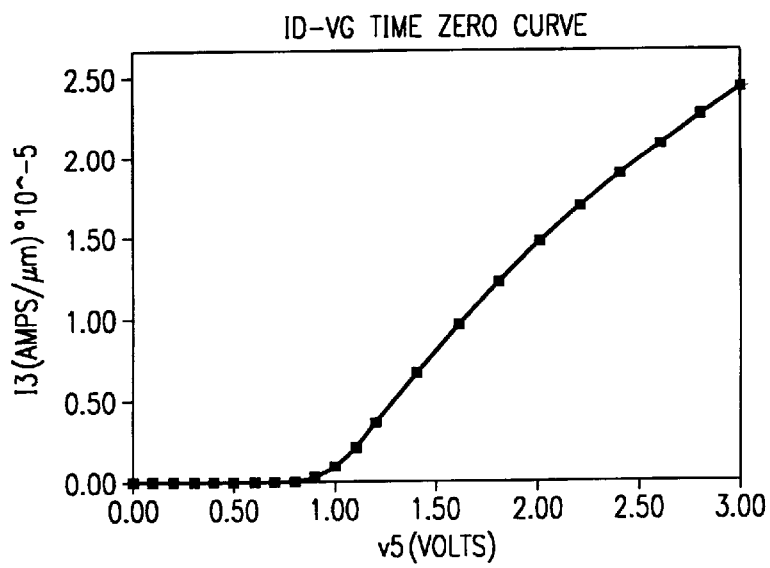
FIG. 3 provides a curve illustrating the drain current-gate voltage time zero curve.

FIG. 3 illustrates a drain current versus gate voltage times zero curve for the structure of FIG. 1. In particular, until voltage reaches approximately 1 V, drain current remains at an approximately zero level. Thereafter, drain current increases approximately linearly at a rate of approximately $1.4 \times 10^{-5}$ A/μm per volt.

Figure 4:
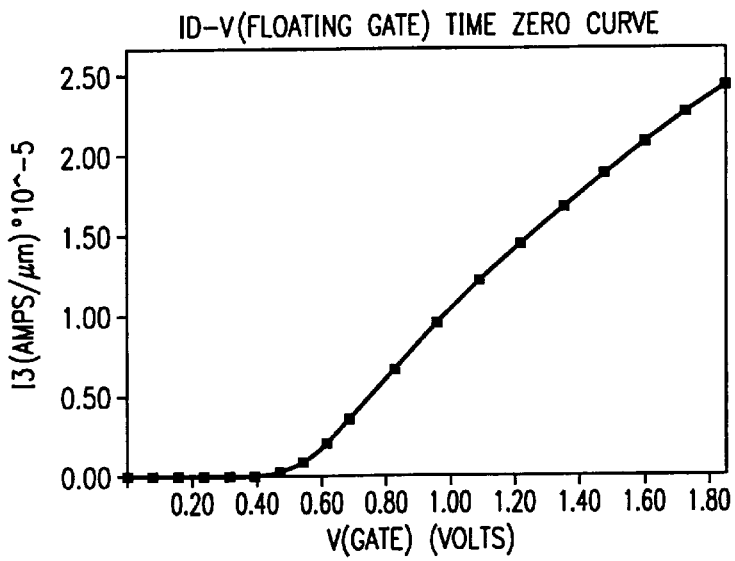
FIG. 4 depicts the floating gate voltage time zero curve.

FIG. 4 illustrates a drain current versus floating gate voltage time zero curve for the structure of FIG. 1. As FIG. 4 shows, until gate voltage reaches approximately 0.5 V, drain current remains at an approximately zero level. Thereafter, drain current increases at approximately a linear rate of $1.8 \times 10^{-5}$ A/μm per volt.

Figure 5:
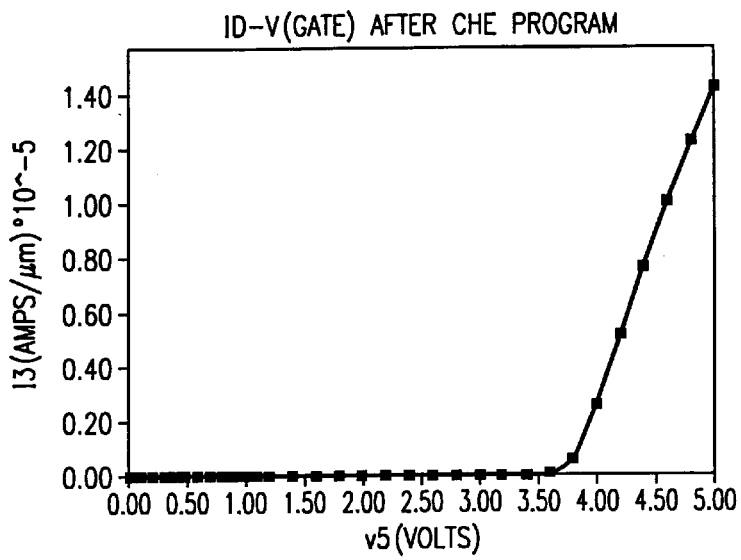
FIG. 5 graphs the drain current-gate voltage curve after CHE programming of the present invention.

FIG. 5 shows a curve of the drain current versus gate voltage after CHE programming for the structure of FIG. 1. As FIG. 5 shows, until approximately 3.5 V, drain current remains at approximately zero amps. After approximately 3.6 V, drain current increases approximately linearly at a rate of 1.2 A/μm per volt.

Figure 6:
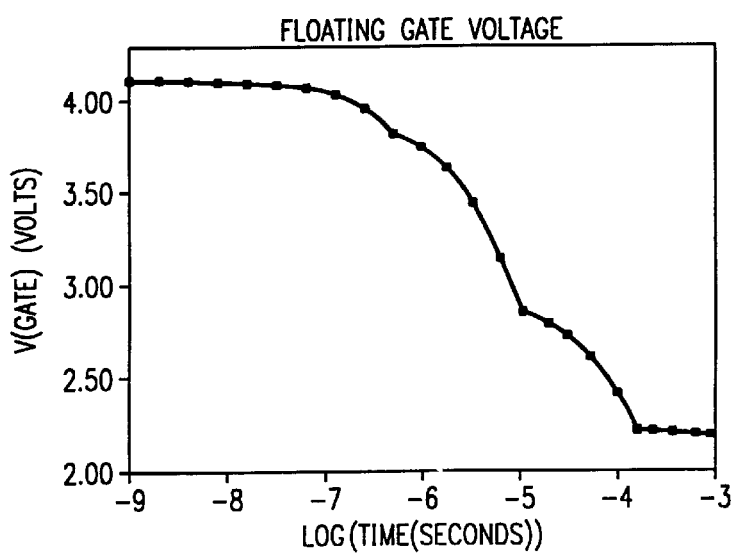
FIG. 6 shows the drain current-floating gate voltage during programming.

FIG. 6 illustrates a plot of the floating gate voltage during CHE programming. As FIG. 6 shows, at $10^{-9}$ seconds, gate voltage is approximately 4 V, and decreases at an approximately constant deceleration rate until at $10^{-5}$ seconds to a voltage of approximately 2.7 V. Then, the voltage decreases at a slower deceleration rate until at $10^{-4}$ seconds and a voltage of 2.2 V. Then, with a constant negative rate, the voltage levels to approximately 2.2 V.

Figure 7:
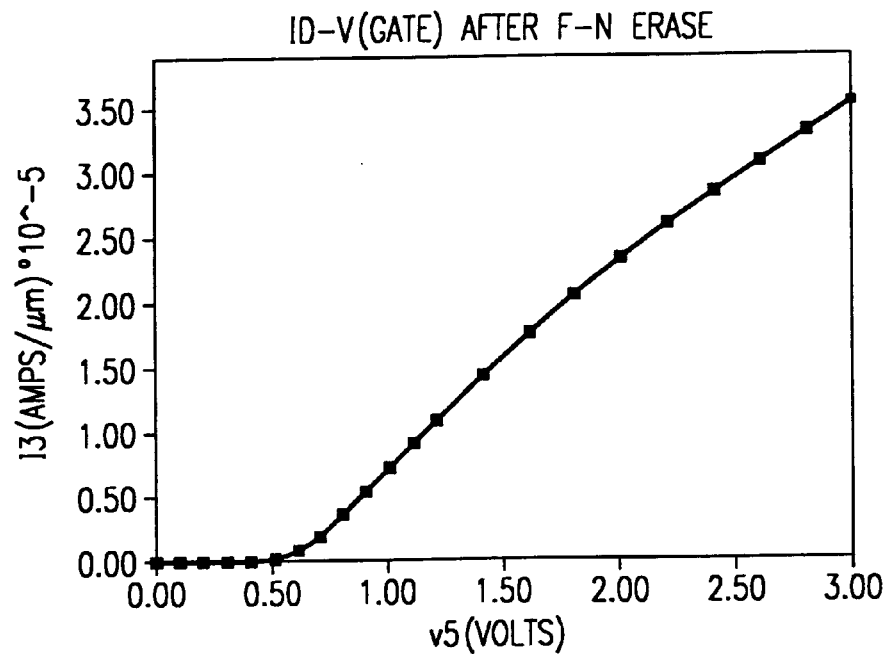
FIG. 7 plots the drain current-gate voltage characteristic of the present invention after an F-N erase step.

FIG. 7 illustrates the drain current versus gate voltage after an F-N erase step for the structure of FIG. 1. Referring to FIG. 7, until approximately 0.5 V, drain current maintains at a zero level. Thereafter, drain current increases at a rate of approximately $1.7 \times 10^{-5}$ A/μm per volt.

Figure 8:
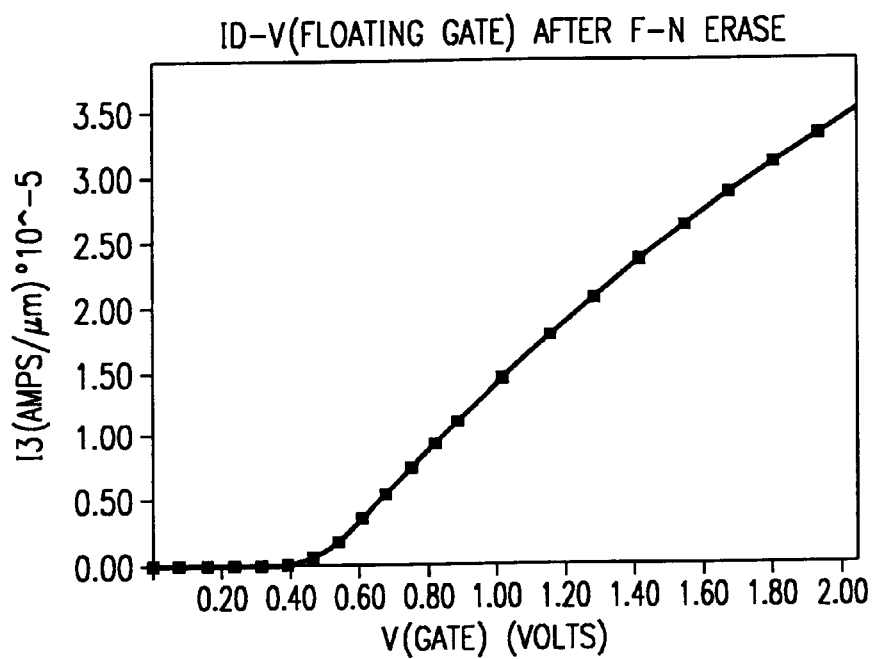
FIG. 8 illustrates the drain current-floating gate voltage characteristic of the present invention after an F-N erase step.

FIG. 8 illustrates a curve of drain voltage versus floating gate voltage after an F-N erase step. In FIG. 8, until gate voltage reaches approximately 0.4 V, drain current remains approximately zero. Thereafter, drain current increases at a rate of approximately $2.5 \times 10^{-5}$ A/μm per volt.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A single polysilicon memory cell, comprising:
a P-substrate;
a P-well disposed within said P-substrate;

an NMOS transistor disposed within said P-well; and an N⁺ control gate disposed in said P-well;

an electrically isolated polysilicon gate in common with said NMOS transistor and said N⁺ control gate for operating as a floating gate in common with said NMOS transistor and said N⁺ control gate;

said N⁺ control gate further comprising a P-channel punch-through implant region for increasing the capacitive coupling ratio to improve programming and erasing efficiency within said single polysilicon memory cell.

2. The single polysilicon memory cell of claim 1, wherein said N⁺ control gate comprises a phosphorous implant region.

3. The single polysilicon memory cell of claim 1, wherein said N⁺ control gate comprises an arsenic implant region.

4. The single polysilicon memory cell of claim 1, wherein said N⁺ control gate is formed with no processing steps in addition to that required for forming said NMOS transistor, said N⁺ control gate, and said electrically isolated polysilicon gate.

5. The single polysilicon memory cell of claim 1, wherein said programming voltage is not greater than approximately 5 volts.

6. The single polysilicon memory cell of claim 1, wherein said erasing voltage is not greater than approximately 9 volts on $V_{DD+}$ and $V_{SS}$ and not less than approximately 0 volts on $V_{PP}$ and $V_{BB}$, where $V_{DD}$ and VSS are the voltage across the NMOS transistor, $V_{PP}$ is the voltage on the control gate and $V_{BB}$ is the voltage applied to the P-well.

7. The single polysilicon memory cell of claim 1, wherein said single polysilicon memory cell is programmed with a threshold voltage shift of more than approximately 2.5 volts in a period of not more than approximately 100 microseconds.

8. The single polysilicon memory cell of claim 1, wherein during an erasing process, a threshold voltage recovery occurs in a time of not greater than approximately 1 millisecond.

* * * * *